United States Patent
Zhou et al.

(10) Patent No.: US 7,550,979 B2
(45) Date of Patent: Jun. 23, 2009

(54) SYSTEM AND METHOD FOR MEASURING CONDUCTIVITY OF FLUID

(75) Inventors: Qinming Zhou, Arcadia, CA (US); Gert Burkhardt, Pasadena, CA (US)

(73) Assignee: Georg Fischer Signet LLC, El Monte, CA (US)

( * ) Notice: Subject to any disclaimer, the term of this patent is extended or adjusted under 35 U.S.C. 154(b) by 170 days.

(21) Appl. No.: 11/754,969

(22) Filed: May 29, 2007

(65) Prior Publication Data

US 2008/0297173 A1     Dec. 4, 2008

(51) Int. Cl.
 *G01R 27/08* (2006.01)
(52) U.S. Cl. .................. 324/693; 324/439; 324/442; 73/25.03; 73/335.05; 702/45; 702/57
(58) Field of Classification Search ............ 324/693, 324/439–450
See application file for complete search history.

(56) References Cited

U.S. PATENT DOCUMENTS

| | | | | |
|---|---|---|---|---|
| 3,778,705 A * | 12/1973 | Maltby | ........... | 324/663 |
| 3,936,738 A * | 2/1976 | Maltby | ........... | 324/71.1 |
| 4,132,944 A * | 1/1979 | Bentz | ........... | 324/441 |
| 4,808,930 A * | 2/1989 | Kaiser | ........... | 324/442 |
| 5,172,332 A * | 12/1992 | Hungerford et al. | ...... | 700/267 |
| 5,260,663 A * | 11/1993 | Blades | ........... | 324/442 |
| 5,334,940 A | 8/1994 | Blades | | |
| 5,504,430 A * | 4/1996 | Andersson | ...... | 324/439 |
| 5,587,520 A * | 12/1996 | Rhodes | ........... | 73/25.03 |
| 5,708,363 A * | 1/1998 | Yates et al. | ........ | 324/442 |
| 5,777,206 A * | 7/1998 | Zuchner et al. | ...... | 73/29.01 |
| 6,223,129 B1 | 4/2001 | Chan et al. | | |
| 6,232,786 B1 | 5/2001 | Barnett | | |
| 6,690,173 B2 | 2/2004 | Blades | | |
| 6,750,661 B2 * | 6/2004 | Brooks et al. | ...... | 324/693 |
| 6,804,613 B2 * | 10/2004 | Ishikawa et al. | ...... | 702/45 |
| 6,967,489 B2 * | 11/2005 | Brooks et al. | ...... | 324/693 |
| 7,429,865 B2 * | 9/2008 | Dreibholz et al. | ...... | 324/692 |
| 2002/0083767 A1 * | 7/2002 | Kemp | ........... | 73/292 |
| 2005/0049805 A1 * | 3/2005 | Bonne et al. | ...... | 702/57 |

OTHER PUBLICATIONS

Sherman, R. E., et al., "Analytical Instrumentation: Practical Guides for Measurement and Control", (1996), pp. 418-419.

* cited by examiner

*Primary Examiner*—Timothy J Dole
*Assistant Examiner*—Benjamin M Baldridge
(74) *Attorney, Agent, or Firm*—Tsircou Law, P.C.

(57) ABSTRACT

A system and related method are provided to calibrate for wire capacitance during use to minimize error in conductivity measurement of the target fluid. The system includes a signal generator configured to drive the conductivity cell and the temperature element, with an alternating current (AC) drive signal having variable parameter. The system further includes a processor assembly electrically coupled to the conductivity cell and the temperature element to calculate a conductivity value of the fluid. The conductivity value is a function of the values of the temperature measurement, the compensation measurement, and the raw conductivity measurement, thereby compensating the conductivity value for capacitance effects. In this manner, the system effectively compensates for capacitance attributable to wiring extending between the electrode and other electronics of the sensor, usable with wiring of varied and unknown lengths.

18 Claims, 3 Drawing Sheets

SYSTEM AND METHOD FOR MEASURING CONDUCTIVITY OF FLUID

BACKGROUND OF THE INVENTION

The present invention relates generally to a system for measuring conductivity or resistivity of a fluid and, more particularly, to such systems that further measure temperature and compensate for capacitance effects.

Conductivity/resistivity sensors have long been used to measure ionic concentration in target fluids. Measurement of conductivity or resistivity of a fluid provides useful information in varied industrial applications. Such measurements aid determining purity of fluid and detecting contamination or chemical concentration of fluid, in industrial processes across many industries such as pharmaceutical, food, chemical, wastewater treatment, and semiconductor manufacturing. Temperature sensing of the target fluid also provides useful information in industrial processes and can be used to compensate conductivity measurements based on the temperature of the fluid, since the conductivity of a given fluid is a function of temperature.

Conductivity sensors typically apply a potential difference across the target fluid, driving ionic current and forming a conductance cell in the target fluid. Conductivity sensors (or electrodes) are typically constructed as two metal pieces electrically connected by the fluid of interest. During measurement, an AC (alternating current) voltage (typically sine wave or square wave) is applied between the two plates and the current through the fluid is measured. Generally speaking, the ionic current through the target fluid is proportional to the applied potential difference, i.e. applied voltage (V). The resistance (R) of the target fluid equals the potential difference (V) over the current, (i.e., R=V/I). The conductance of the target fluid is defined as the reciprocal of the resistance. Ideally, electrolyte resistance, or conductivity would be easy to determine. In practice, however, such conductance cells often encounter additional electrical processes that must be considered.

Conductivity sensors for fluids commonly employ AC signals, such as sine wave or square wave, rather than DC signals. DC signals are problematic in that they tend to cause ion migration in the fluid and polarization, among other things. Such errors are exceedingly difficult to characterize with any accuracy, making DC signals impractical for such conductivity sensors. Thus, most conductivity sensors use AC signals having relatively low amplitude to minimize polarization.

With knowledge of the conductance cell and related parameters, ionic concentration and purity of the target fluid can be determined. To aid in calculating the desired parameters of the conductance cell, behavior of the conductance cell can be modeled by adopting an equivalent electrical circuit that imitates performance of the conductance cell.

With reference to FIG. 1, a schematic model of an equivalent electrical circuit is depicted for a common conductance cell, having two electrodes exposed to a target fluid and driven by an alternating current (AC). A list of equivalent components representing electrical process of the cell are provided, as follows:

R: Electrolyte Resistance
$R_d$: Faradic Impedance, or Electrode—Solution Interface Resistance
$C_d$: Double Layer Capacitance, or Electrode—Solution Interface Capacitance
$C_p$: Parallel Capacitance
$C_w$: Signal Lead or Wire Capacitance Most commercially available electrodes have relatively high $C_d$ (in the uF range). Normally, the driving frequency is chosen such that the equivalent impedance of $C_d$ is very small (close to zero), allowing the AC current to bypass $R_d$. Thus, the effects from $C_d$ and $R_d$ can be minimized and in many applications neglected. A capacitive effect between the electrodes of the cell is commonly referred to as parallel capacitance ($C_p$). Parallel capacitance ($C_p$) is related to the geometry of the electrode and can be calibrated during development of the electronics.

However, capacitive effects of wiring used to connect the electrodes to other electronics of the system is commonly referred to as wire capacitance ($C_w$), and tends to contribute to measurement error. Wire capacitance tends to be difficult to characterize, particularly without detailed knowledge of parameters of the wire. Various parameters of wires or cables used in the sensor assembly, such as, length, materials used and wire gauge, impact the wire capacitance observed. Moreover, minimizing the length of the wire or cable reduces the capacitance effect. If the aforementioned parameters are known, wire capacitance can be characterized in some manner. It should be noted that the value attributable to wire capacitance is subject to aging of the wire and changes in temperature.

Current approaches for measuring conductivity often require a fixed cable length having known parameters connected to the electrode or, alternatively, a cable of minimal length to minimize the impact of capacitance attributable to the wiring extending between the electrode within the target fluid and the remaining electronics of the sensor assembly.

Although the aforementioned approaches are generally effective, shortfalls existed. For example, to maintain accurate measurements, the cable length must be known. A user cannot modify the length of the cable used, even if desired. Thus, a customer cannot use an electrode from other vendor, which may use different material, wire gauge and length; since high measurement errors may occur.

Some attempt to minimize capacitance effects by using complex circuitry and processes, which raises different issues. For example, some approaches attempt to pre-charge the cell prior to reading a measurement, in an attempt to minimize capacitance effects. Such approaches, however, require drive signals at comparatively low frequencies, which increase the risk of polarization, and require wiring or cables that are relatively short, and the user is limited in the length of cable that can be used.

It should be appreciated that there remains a need for a system for measuring conductivity of a fluid that enables use of relatively long wiring, or even unknown wire length, without adversely impact measurement accuracy. The present invention fulfills this need and others.

SUMMARY OF THE INVENTION

In general terms, the present invention provides a system for measuring conductivity of a fluid. The system is configured to calibrate for wire capacitance, during use, to minimize error in conductivity measurement of the target fluid. The system includes a signal generator configured to drive a conductivity cell and a temperature element, with an alternating current (AC) drive signal, to include (a) driving the temperature element with a first drive signal having an initial frequency that is greater than or equal to zero, resulting in a temperature measurement, (b) driving the temperature element with a second drive signal having an initial frequency that is greater than the initial frequency of the first drive signal, resulting in a compensation measurement, and (c)

driving the conductivity cell with an AC drive signal having a third frequency greater than the first frequency, resulting in a raw conductivity measurement. The term "raw conductivity measurement," unless otherwise specified, is intended to refer to and be inclusive of a conductivity value prior to compensation for wire capacitance effects.

The system further includes a processor assembly electrically coupled to the conductivity cell and the temperature element to calculate a conductivity value of the fluid. The conductivity value is a function of the values of the temperature measurement, the compensation measurement, and the raw conductivity measurement, thereby compensating the conductivity value for capacitance effects. In this manner, the system effectively compensates for capacitance attributable to wiring extending between the electrode and other electronics of the system, usable with wiring of varied and unknown lengths.

A method for measuring conductivity of a fluid is also provided. The method includes:

driving a temperature element exposed to a target fluid with a first drive signal having an initial frequency that is greater than or equal to zero, resulting in a temperature measurement;

driving the temperature element with a second drive signal having an initial frequency that is greater than the initial frequency of the first drive signal, resulting in a compensation measurement;

driving a conductivity cell exposed to a target fluid with an AC drive signal having a third frequency greater than the first frequency, resulting in a raw conductivity measurement; and calculating a conductivity value of the fluid that is selectively compensated for capacitance effects, wherein the conductivity value is a function of the values of the temperature measurement, the compensation measurement, and the raw conductivity measurement.

For purposes of summarizing the invention and the advantages achieved over the prior art, certain advantages of the invention have been described herein. Of course, it is to be understood that not necessarily all such advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment disclosed.

BRIEF DESCRIPTION OF THE DRAWINGS

Embodiments of the present invention will now be described, by way of example only, with reference to the following drawings in which.

DETAILED DESCRIPTION OF THE PREFERRED EMBODIMENTS

Figure 1:
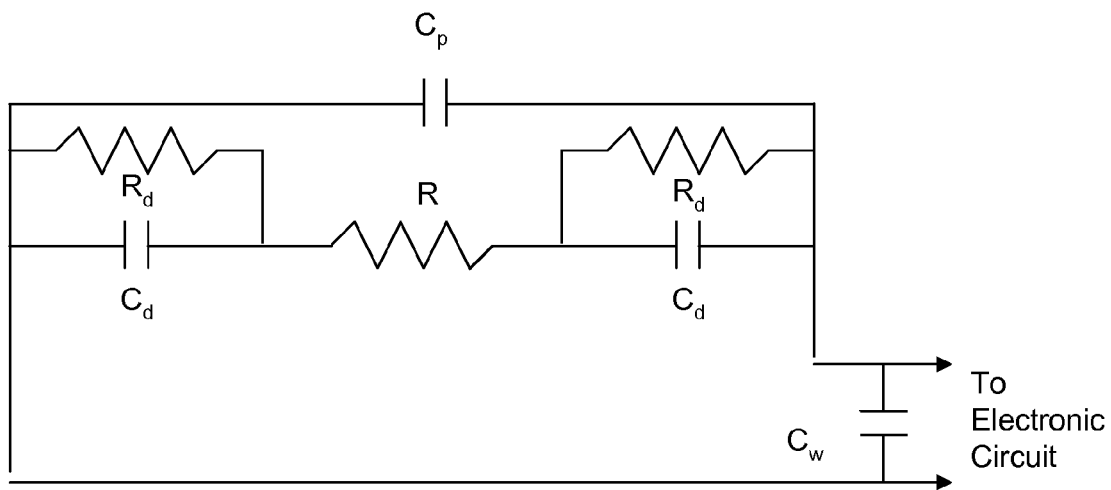
FIG. 1 is a simplified circuit model for a conductance cell.
Figure 2:
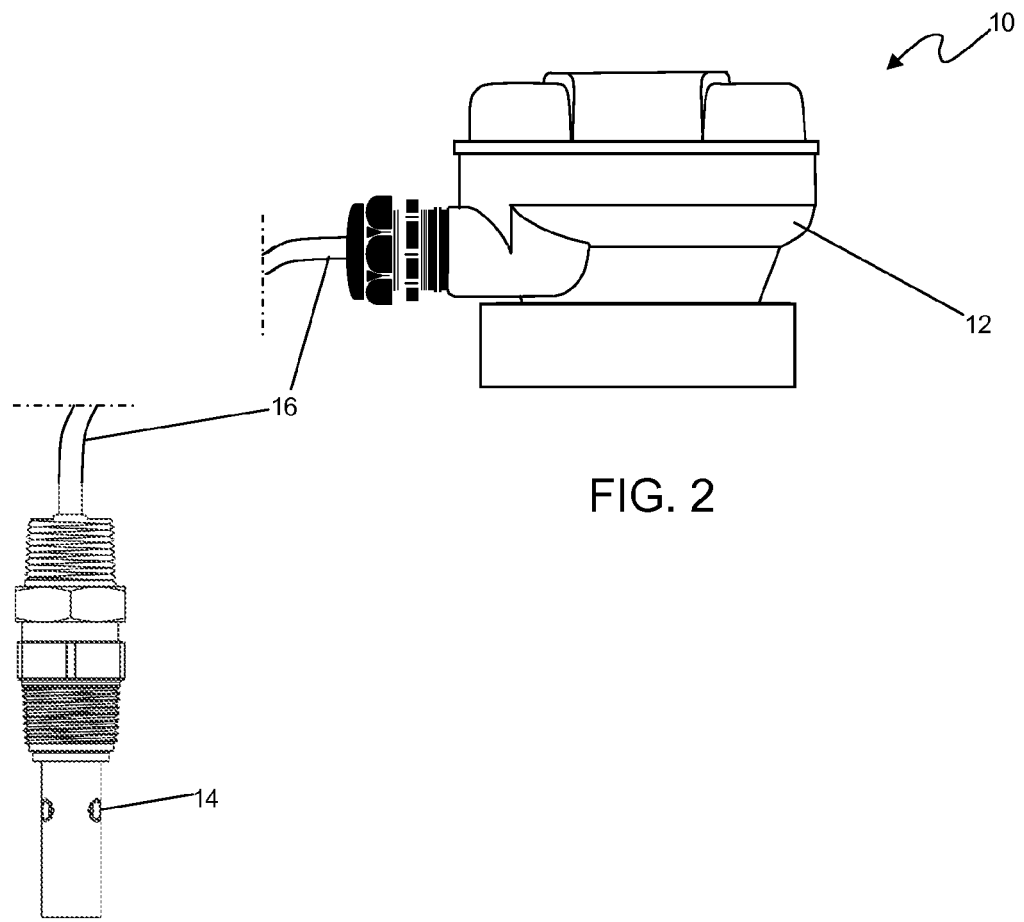
FIG. 2 is an elevational view of a first embodiment of a system for measuring conductivity of a fluid in accordance with the present invention, depicting an electronics housing coupled to a sensor housing via a cable.
Figure 3:
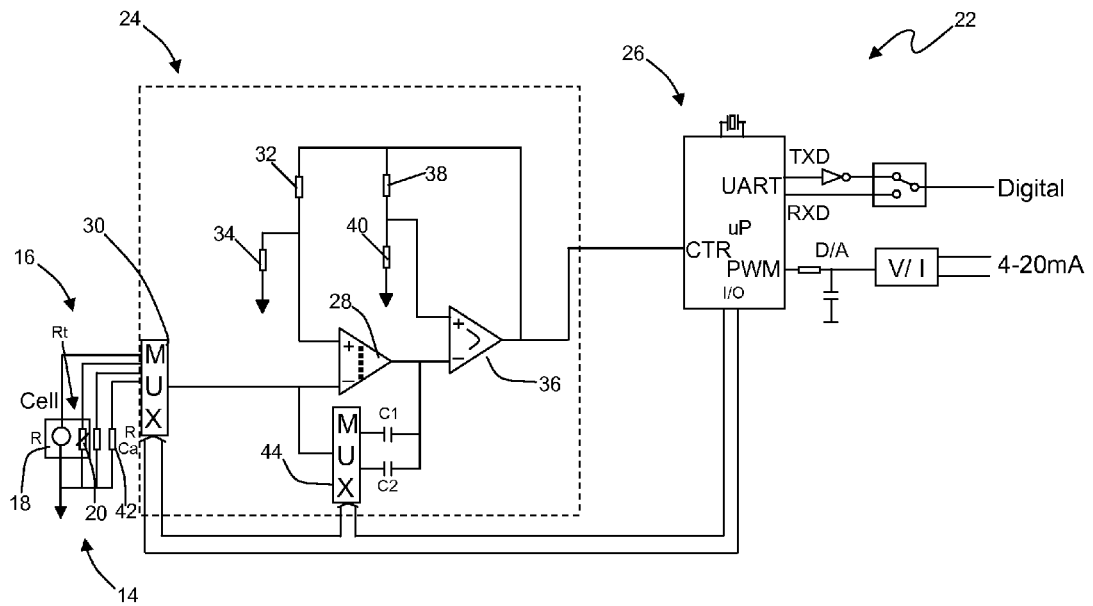
FIG. 3 is a simplified schematic circuit of the system of FIG. 2.

Referring now to the drawings, there is shown system assembly 10 for measuring conductivity and temperature of a target fluid. Referring to FIG. 2, the system assembly 10 includes an electronics housing 12 and a sensor 14 coupled to electronics disposed within the housing via cable 16. The sensor is configured expose a conductivity cell 18 and temperature element 20 therein to a target fluid. Referring to FIG. 3, the conductivity cell and temperature element are electrically coupled to an electronics subsystem 22 that resides in the electronics housing 12.

The system assembly 10 is configured to accurately measure the electrolytic conductivity (or resistance) and temperature of the target fluid, while minimizing potential error attributable to capacitance effects. More particularly, the electronics subsystem 22 is configured to compensate for wire capacitance, during use, to minimize error in the conductivity measurement of the target fluid. Compensation occurs without requiring knowledge of detailed parameters of the cable, to include cable length. In this manner, a user can mount the electronic housing 12 apart from the sensor 14, using a suitable yet unknown cable length, without adversely impact measurement accuracy. Accordingly, the electronic subsystem can be used in conjunction with various different electrode assemblies and cables attached thereto, and yet calibrate the aforementioned capacitance effects.

Figure 4:
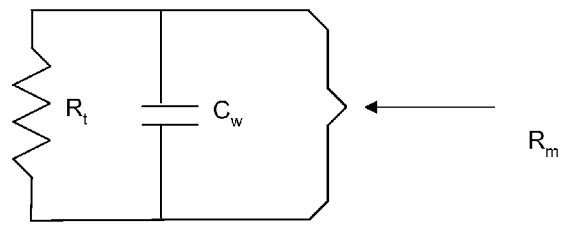
FIG. 4 is a simplified circuit model for a temperature element of the system of FIG. 2.

The system 10 determines a value attributable for wire capacitance ($C_w$) by driving the temperature element at high frequency and at low frequency. Referring to FIG. 4, a schematic electrical model is depicted, showing the resistance ($R_t$) of the temperature element 20 in parallel with wire capacitance ($C_w$). With AC signal is applied, the wire capacitance ($C_w$) will induce an equivalent resistance (or impedance) ($R_w$) at the driving frequency ($f_r$). Thus, measured resistance ($R_m$), at the driving frequency ($f_r$), can be expressed with respect to resistance ($R_m$) attributable induced wire capacitance, and resistance ($R_t$), as follows:

$$1/R_m = 1/R_t + 1/R_w, \text{ where } R_w = 1/(2\pi f_r C_w)$$

Accordingly, driving the temperature element 20 at a high frequency should induce wire capacitance effects, and driving the temperature element at low frequency ($f_{tl}$) should reduce capacitance effects, such that, the measured resistance ($R_{ml}$) at the low frequency would generally be equivalent to the resistance ($R_t$) of the temperature element, (i.e., $R_{ml} \approx R_t$, and if driven by a direct current (DC), then $R_{ml} = R_t$).

To calculate the wire capacitance, wire capacitance effect is induced by driving the temperature element at a high driving frequency ($f_{th}$), resulting in a measured resistance ($R_{mh}$). Using a measured resistance ($R_{mh}$) and driving frequency ($f_{th}$) in the above equation, and substituting measured resistance ($R_{ml}$) for temperature resistance ($R_t$), wire capacitance can be expressed in known parameters (i.e., $R_{mh}$, $R_{ml}$, and $f_{th}$), as follows:

$$1/R_{mh} = 1/R_{ml} + 2\pi f_{th} C_w, \text{ or}$$

$$C_w = (1/R_{mh} - 1/R_{ml})/(2\pi f_{th})$$

With wire capacitance known, the electronic subsystem 22 can compensate for error attributable to wire capacitance in the measured resistance ($R_m$) of the conductivity sequence. Because of their parallel relationship, electrolyte resistance (R) of the target fluid can be modeled as a function of measured resistance ($R_m$) of the conductivity sequence accounting for resistance of wire capacitance ($R_w$), as follows:

$$1/R_m = 1/R + 1/R_w = 1/R + 2\pi f_h C_w; \text{ and}$$

$$R = 1/(1/R_m - 2\pi f_h C_w) = 1/[1/R_m - (1/R_{mh} - 1/R_{ml})f_h/f_{th}]$$

In this manner, accurate measurements for the conductivity of a fluid can be achieved, including compensated wire capacitance, without requiring knowledge of detailed parameters of the cable, to include cable length and gauge information.

With reference now to FIG. 3, the electronics subsystem 22 includes a signal generator 24 and a processor assembly 26. The signal generator is configured to drive the conductivity cell 18 and the temperature element 20.

The signal generator 24 includes a first op-amp 28 coupled to a first multiplexer (MUX) 30. The multiplexer 30 is an analog multiplexer controlled by the processor assembly 26 through the I/O ports of the processor assembly. The multiplexer 30 is coupled to the sensor 14 receiving each of the measurement devices of the sensor in separate input channels. The multiplexer 30 is configured to switch input channels among the conductivity cell 18, the temperature element 20, and on-board precise calibration resistor(s) 42. The output of the multiplexer 30 is fed into the first op-amp 28, forming an inverting integrator. The non-inverting terminal of first op-amp 28 is connected to a voltage divider formed by resistors 32 and 34, which set amplitude of driving signal.

The output of the first op-amp 28 is fed into an inverting terminal of a second op-amp 36. The non-inverting terminal of the second op-amp 36 is connected to another voltage divider formed by resistors 38 and 40 that set the threshold at which the output of second op-amp 36 will flip polarity when the voltage output of first stage is integrated to the threshold level. The output polarity change of the second op-amp 36 results in the polarity change of two voltage dividers previously mentioned and a square wave AC signal is generated as such. The frequency of AC signal will be directly proportional to input conductance, if parameters of other components of the signal generator 24 remain unchanged.

The signal generator 24 further includes a first capacitor (C1) and a second capacitor (C2) coupled to a second multiplexer (MUX) 44. The capacitors (C1, C2) are in the feedback loop of the first op-amp 28. The processor assembly 26 is configured to control the timing constant of the integration, allowing the circuit to switch between a high driving frequency range, when capacitor (C1) is selected, and low driving frequency range, when capacitor (C2) is selected.

Preferably, the value of the first capacitor (C1) is selected such that the driving frequency is high enough to minimize polarization effect of conductivity cell 18. The capacitance value of the second capacitor (C2) is selected such that the measurement error induced by the wire capacitance is very small and negligible at the driving frequency when capacitor (C2) is selected.

In other embodiments, various other approaches can be used for generating drive signals that can vary frequencies, as needed, such as a sine-wave generator with selectable frequency bandwidth, an oscillator with a frequency tuner, or signals generated from a microprocessor.

In the exemplary embodiment, the conductivity cell 18 includes two metal electrodes spaced apart from one another and configured to be exposed to the target fluid. The temperature element 20 is a thermister (PT1000) having a resistance-temperature co-efficiency of about 3.8Ω/° C., e.g. the thermister will increase its resistance by about 3.8Ω for every degree Celsius of fluid temperature increase. At 0° Celsius, the thermister shows a resistance of 1000Ω. In other embodiments, various other configurations for the conductivity cell and the temperature device can be used. For example, temperature elements such as PT100, Balco, and so on, can be used. In other embodiments, various other conductivity cell can be used e.g., such as conductivity cells configured with electrodes comprising graphite, conductive rubber, and so on.

The processor assembly 26 processes the measurement signals from the conductivity cells and the temperature element to provide output values for conductivity (or resistance) and temperature of the fluid. In the exemplary embodiment, the processor assembly provides the output value in either a digital signal or an analog signal.

Figure 5:
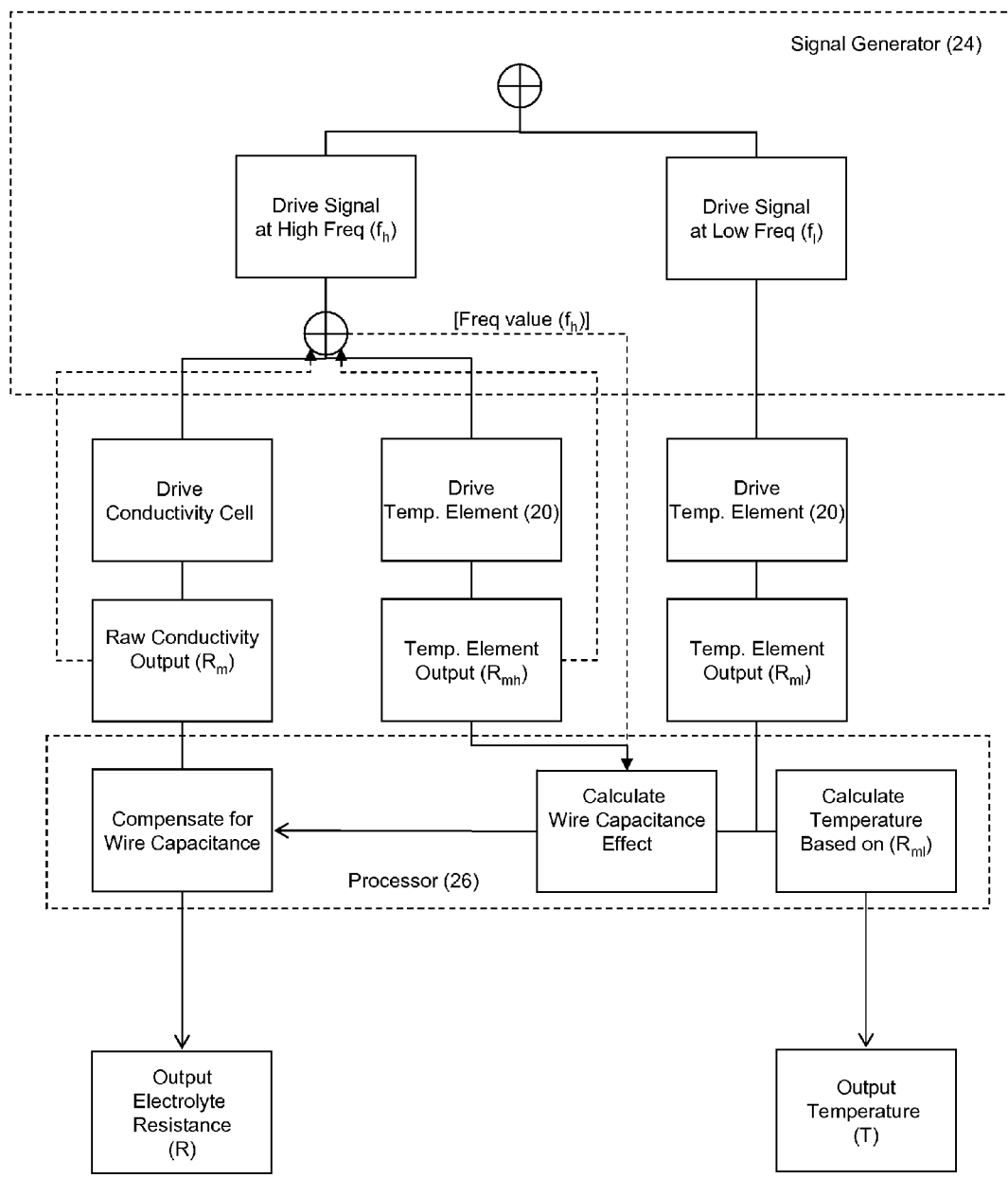
FIG. 5 is a simplified flow chart of operation of the system of FIG. 2.

Referring to FIG. 5, the electronics subsystem 22 is configured to vary the frequency of the drive signal at prescribed intervals including (a) measuring conductivity, (b) measuring resistance of the temperature element 20, and (c) compensation of wire capacitance. In the exemplary embodiment, the electronics subsystem cycles between the sequence for measuring conductivity and the sequence for measuring temperature, and runs a compensation sequence after every eight conductivity-temperature cycles.

During the sequence for measuring conductivity, the electronic subsystem 22 provides a drive signal at comparatively high frequency, to minimize polarization effect. The frequency range in the exemplary circuit is from 10 Hz to about 5 kHz, corresponding to resistance input from about 1.3MΩ to 50Ω.

During sequences for measuring temperature, the electronic subsystem 22 provides a drive signal at a comparatively low frequency, to minimize capacitance effects including that attributable to wire capacitance. In the exemplary embodiment, the frequency is between about 320 Hz and about 720 Hz, corresponding to a resistance of about 1.6 kΩ to about 700Ω of the temperature element. However, in other embodiments, a DC signal can be used for the temperature measurement without departing from the invention.

During the compensation sequence, the electronic subsystem 22 provides a drive signal at comparatively high frequency to drive the temperature element 20. In the exemplary embodiment, a frequency between about 3.4 kHz and about 7.2 kHz is used, corresponding to a resistance of about 1.6 kΩ to about 700Ω of the temperature element. Driving the temperature element at a high frequency should induce capacitance effect, particularly wire capacitance, resulting in a measured resistance ($R_{mh}$) lower than the resistance ($R_{ml}$) measured during the temperature measuring sequence. In the exemplary embodiment, the driving frequency ($f_{th}$) during the compensation sequence is preferably in the same frequency range as the driving frequency ($f_c$) of the conductivity sequence.

With continued reference to FIG. 5, during start up, the electronics subsystem 22 operates a start sequence, as follows: (1) calibrate system with on board precision resistor at low frequency, (2) calibrate system with on board precision resistor at high frequency, (3) measure resistance of the temperature element and temperature at low frequency, (4) measure resistance of the temperature element at high frequency and calculate wire capacitance, (6) measure conductivity at high frequency and compensate wire capacitance. In the exemplary embodiment, each step takes about 300 milliseconds. The order and timing of the steps can be varied without departing from the invention.

After the startup sequence, the system will go into regular repetitive operation, as follows: (1) measure temperature at low frequency, (2) measure conductivity at high frequency and compensate wire capacitance, and then back to sequence (1). After about eight iterations of the repetitive sequences, the system will insert one additional sequence into the regular cycle: (3) measure the resistance of the temperature element at high frequency and calculate wire capacitance. The order and timing of the steps can be varied without departing from the invention. In certain embodiments, the calibration sequence can occur less frequently or excluded entirely, after start up or after initial installation calibration. Nonetheless, inclusion of the compensation sequence enables compensation for any possible drift of wire capacitance ($C_w$), for example, such as that due to temperature drift or aging of the cable, to increase accuracy.

To further demonstrate the benefits of the system, consider the following example: The following example is given as a particular implementation to further demonstrate the benefits of the system. This example should be construed only as illustrative, and it does not limit the remainder of the disclosure or the claims.

EXAMPLE

In an exemplary test, the system assembly includes a sensor having stainless steel electrodes with a cell constant of about 1.0, coupled to an electronics subsystem. To provide a baseline, the sensor assembly was operated without benefit of capacitance compensation sequence. Thereafter, the sensor assembly was operated with benefit of the compensation sequence. During both testing sequences, the length of the cable connecting the sensor to the electronics was varied from 3 inches to 15 feet, with measurements taken used both lengths of cables. In this manner, the benefit of the capacitance compensation can be demonstrated In the baseline test, the sensor was driven by high frequency signal and measurements of conductivity and temperature were taken of a standard conductivity solution of 1000 uS/cm±0.25% at 25° C. The cable having a length of about 3 inches was used. The system resulted in an error of +0.65% for conductivity and an error of +0.3° C. for temperature. Next, a cable having a length of about 15 feet was used, and the test was repeated in the same standard solution, resulting an error of +1.85% for conductivity and an error −2.7° C. for temperature. Thus, the 15-foot cable induced additional +1.2% error for the conductivity measurement and −3° C. for the temperature measurement.

Next, the sensor assembly was operated with benefit of the compensation sequence, using the same solution as described above. The conductivity cell was driven by high frequency. The temperature element was driven by low frequency during measurement and was driven by high frequency during capacitance compensation. Measurements were taken using a cable length of 3 inches and 15 feet. The system read the same accuracy for the conductivity and temperature measurement as the short cable test above before the compensation sequence and algorithm was implemented. Using a 15-foot cable, the system resulted in an error of just of 0.77 percent for conductivity and an accuracy of 0° C. for temperature.

Using the compensation sequence, error of the temperature measurement was reduced tenfold relative to the baseline test to −0.3 degrees Celsius, and error of the conductivity measurement was reduced tenfold relative to the baseline test to 0.12 percent.

It should be appreciated from the foregoing that the present invention provides a system for measuring conductivity of fluid configured to calibrate for wire capacitance during use to minimize error in conductivity measurement of the target fluid. The system includes a signal generator configured to drive the conductivity cell and the temperature element, with an alternating current (AC) drive signal having variable parameter. The system further includes a processor assembly electrically coupled to the conductivity cell and the temperature element to calculate a conductivity value of the fluid. The conductivity value is a function of the values of the temperature measurement, the compensation measurement, and the raw conductivity measurement, thereby compensating the conductivity value for capacitance effects. In this manner, the system effectively compensates for capacitance attributable to wiring extending between the electrode and other electronics of the sensor, usable with wiring of varied and unknown lengths.

Although the invention has been disclosed in detail with reference only to the exemplary embodiments, those skilled in the art will appreciate that various other embodiments can be provided without departing from the scope of the invention. Accordingly, the invention is defined only by the claims set forth below.

What is claimed is:

1. A system for measuring conductivity of a fluid, comprising:

a signal generator for driving a conductivity cell configured to contact a target fluid and a temperature element configured to measure the temperature of the target fluid, the signal generator configured to generate an alternating current (AC) drive signal having variable parameters, the signal generator configured to (a) drive the temperature element with a first drive signal having an initial frequency that is greater than or equal to zero, resulting in a temperature measurement, (b) drive the temperature element with a second drive signal having an initial frequency that is greater than the initial frequency of the first drive signal, resulting in a compensation measurement, and (c) drive the conductivity cell with an AC drive signal having a third frequency greater than the first frequency, resulting in a raw conductivity measurement; and a processor assembly electrically coupled to the conductivity cell and the temperature element, the processor assembly configured to calculate a conductivity value of the fluid that is compensated by the conductivity value for capacitance effects, such that the compensated conductivity value is a function of the values of the temperature measurement, the compensation measurement, and the raw conductivity measurement.

2. A system as defined in claim 1, wherein the processor assembly compensates for capacitance effects attributable to wiring that connects components of the conductivity cell and the temperature element to components of the processor.

3. A system as defined in claim 1, wherein the signal generator is configured to produce an AC drive signal for driving the conductivity cell that is proportionally related to the value of the raw conductivity measurement.

4. A system as defined in claim 1, wherein the signal generator includes a first capacitor having a capacitance value proportionally related to the numerical value of the frequency of the second drive signal for the temperature element and to the numerical value of the frequency of the third AC drive signal for driving the conductivity cell, and a second capacitor having a capacitance value proportionally related to the numerical value of the frequency of the first drive signal for the temperature element.

5. A system as defined in claim 1, wherein the signal generator is configured to provide a first drive signal having a frequency that is at least ten times less than the frequency of the second drive signal.

6. A system as defined in claim 1, wherein the signal generator includes an integrator op-amp and a comparator op-amp, the integrator op-amp coupled to a first capacitor and a second capacitor having different capacitance values.

7. A system as defined in claim 6, wherein the signal generator includes a first capacitor having a capacitance value proportionally related to the numerical value of the frequency of the second drive signal for the temperature element and to the numerical value of the frequency of the third AC drive signal for driving the conductivity cell, and a second capacitor having a capacitance value proportionally related to the numerical value of the frequency of the first drive signal for the temperature element.

8. A system as defined in claim 1, further comprising a conductivity cell, a temperature element, a sensor housing that accommodates the conductivity cell and the temperature element, and an electronics housing that accommodates selected components of the signal generator and selected components of the processor assembly.

9. A method for measuring conductivity of a fluid, comprising:
  driving a temperature element exposed to a target fluid with a first drive signal having an initial frequency that is greater than or equal to zero, resulting in a temperature measurement;
  driving the temperature element with a second drive signal having an initial frequency that is greater than the initial frequency of the first drive signal, resulting in a compensation measurement;
  driving a conductivity cell exposed to a target fluid with an AC drive signal having a third frequency greater than the first frequency, resulting in a raw conductivity measurement; and
  calculating a conductivity value of the fluid that is selectively compensated for capacitance effects, wherein the conductivity value is a function of the values of the temperature measurement, the compensation measurement, and the raw conductivity measurement.

10. A method as defined in claim 9, wherein generated parameters of the AC drive signal for the conductivity cell are proportionally related to the conductivity measurement signal.

11. A method as defined in claim 9, wherein the signal generator is configured to provide a first drive signal having a frequency that is at least ten times less than the frequency of the second drive signal.

12. A method as defined in claim 9, wherein the signal generator includes an integrator op-amp and a comparator op-amp, the integrator op-amp coupled to a first capacitor and a second capacitor having different capacitance values.

13. A method as defined in claim 12, wherein the signal generator includes a first capacitor having a capacitance value proportionally related to the numerical value of the frequency of the second drive signal for the temperature element and to the numerical value of the frequency of the third AC drive signal for driving the conductivity cell, and a second capacitor having a capacitance value proportionally related to the numerical value of the frequency of the first drive signal for the temperature element.

14. A circuit for measuring conductivity of a fluid, comprising:
  means for driving a conductivity cell configured to contact a target fluid and a temperature element configured to measure the temperature of the target fluid, the signal generator configured to generate an alternating current (AC) drive signal having variable parameters, the signal generator configured to (a) drive the temperature element with a first drive signal having an initial frequency that is greater than or equal to zero, resulting in a temperature measurement, (b) drive the temperature element with a second drive signal having an initial frequency that is greater than the initial frequency of the first drive signal, resulting in a compensation measurement, and (c) drive the conductivity cell with an AC drive signal having a third frequency greater than the first frequency, resulting in a conductivity measurement; and
  means for calculating a conductivity value of the fluid that is a function of the values of the temperature measurement, the compensation measurement, and the raw conductivity measurement, thereby compensating the conductivity value for capacitance effects.

15. A circuit as defined in claim 14, wherein the means for driving includes a first capacitor having a capacitance value proportionally related to the numerical value of the frequency of the second drive signal for the temperature element and to the numerical value of the frequency of the third AC drive signal for driving the conductivity cell, and a second capacitor having a capacitance value proportionally related to the numerical value of the frequency of the first drive signal for the temperature element.

16. A circuit as defined in claim 14, wherein the means for driving is configured to produce an AC drive signal for driving the conductivity cell that is proportionally related to the value of the raw conductivity measurement.

17. A circuit as defined in claim 14, wherein the means for driving includes an integrator op-amp and a comparator op-amp, the integrator op-amp coupled to a first capacitor and a second capacitor having different capacitance values.

18. A circuit as defined in claim 17, wherein the first capacitor having a capacitance value proportionally related to the numerical value of the frequency of the second drive signal for the temperature element and to the numerical value of the frequency of the third AC drive signal for driving the conductivity cell, and a second capacitor having a capacitance value proportionally related to the numerical value of the frequency of the first drive signal for the temperature element.

* * * * *